(12) United States Patent
Skotnicki et al.

(10) Patent No.: US 6,759,721 B2
(45) Date of Patent: Jul. 6, 2004

(54) INTEGRATED SEMICONDUCTOR DRAM-TYPE MEMORY DEVICE AND CORRESPONDING FABRICATION PROCESS

(75) Inventors: Thomas Skotnicki, Crolles-Montfort (FR); Alexandre Villaret, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 141 days.

(21) Appl. No.: 10/174,490

(22) Filed: Jun. 18, 2002

(65) Prior Publication Data

US 2003/0006431 A1 Jan. 9, 2003

(30) Foreign Application Priority Data

Jun. 19, 2001 (FR) .............................................. 01 08051

(51) Int. Cl.⁷ .............................................. H01L 27/14
(52) U.S. Cl. ...................... 257/414; 257/192; 257/223; 257/224; 257/230; 365/183
(58) Field of Search .......................... 365/183; 257/223, 257/224, 192, 230

(56) References Cited

U.S. PATENT DOCUMENTS

| | | | |
|---|---|---|---|
| 4,987,558 A | * | 1/1991 | Slob ........................... 365/183 |
| 5,554,552 A | | 9/1996 | Chi .............................. 437/43 |
| 5,753,952 A | | 5/1998 | Mehrad ....................... 257/316 |
| 6,225,659 B1 | | 5/2001 | Liu ............................. 257/314 |

FOREIGN PATENT DOCUMENTS

WO          98/10925         3/1998          ............. B32B/9/00

* cited by examiner

*Primary Examiner*—David Nelms
*Assistant Examiner*—Mai-Huong Tran
(74) *Attorney, Agent, or Firm*—Lisa K. Jorgenson; Allen, Dyer, Doppelt, Milbrath & Gilchrist, P.A.

(57) ABSTRACT

An integrated memory location structure includes an isolated semiconductor layer between the source region and the drain region of a transistor, and between the channel region and the control gate of the transistor. The isolated semiconductor layer includes two potential well zones separated by a potential barrier zone under the control gate of the transistor. A write circuit biases the memory location structure to confine charge carriers selectively in one of the two potential well zones. A read circuit biases the memory location structure to measure the drain current of the transistor and determine therefrom the stored logic state imposed by the position of the charges in one of the potential well zones.

17 Claims, 14 Drawing Sheets

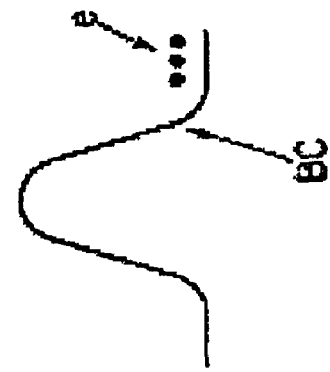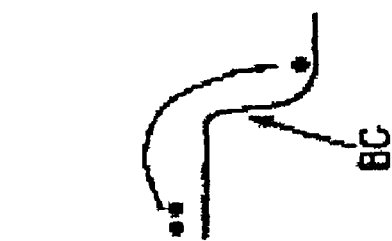
FIG. 2a  Vg = 0  Vds = 0
FIG. 2b  Vg = 0  Vds > 0
FIG. 2c  Vg > 0
FIG. 2d  Vg = 0  Vds = 0

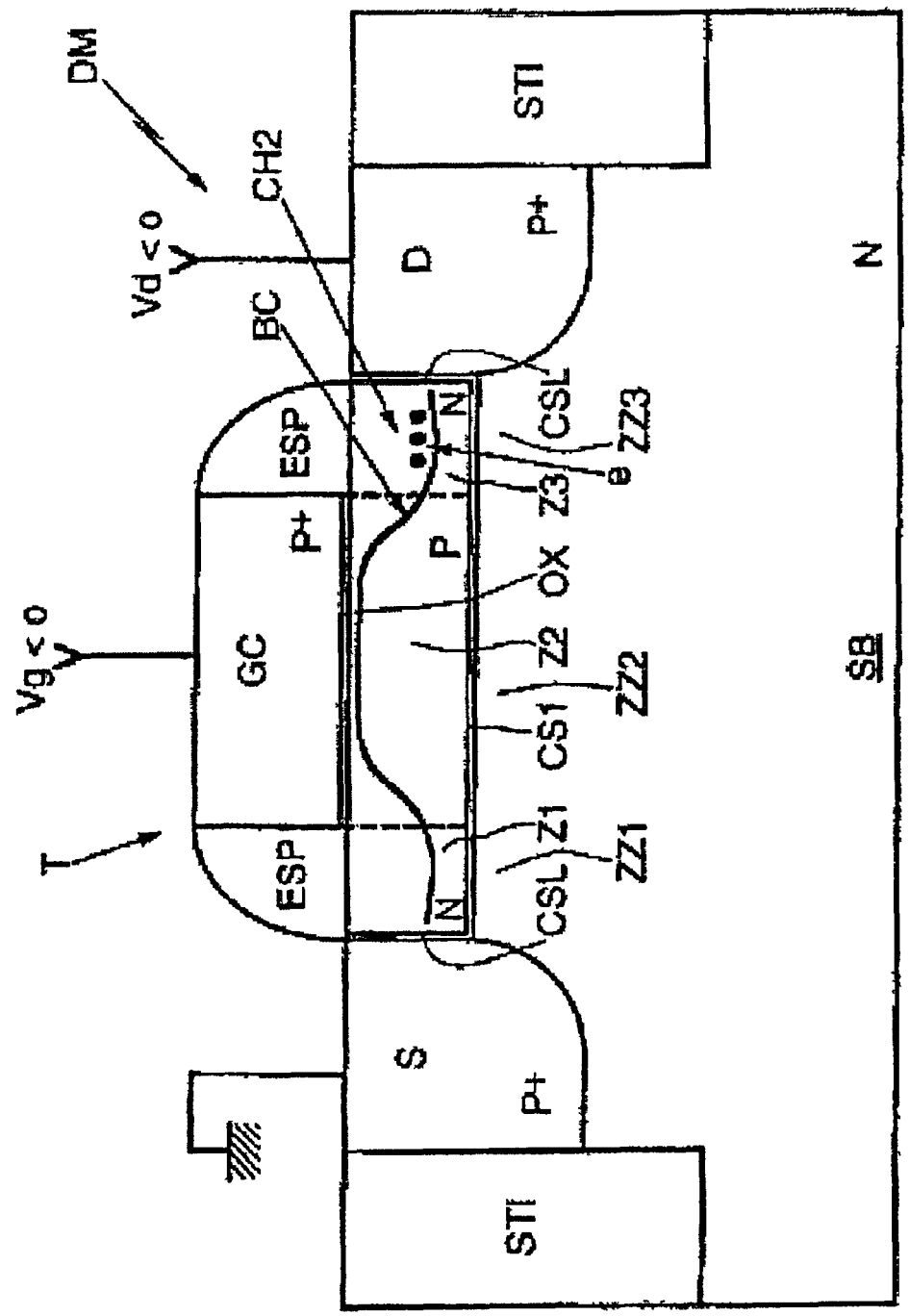

INTEGRATED SEMICONDUCTOR DRAM-TYPE MEMORY DEVICE AND CORRESPONDING FABRICATION PROCESS

FIELD OF THE INVENTION

The present invention relates to integrated circuits, and more particularly, to semiconductor memory devices.

BACKGROUND OF THE INVENTION

Three types of silicon integrated memory devices may be distinguished. A first type is a DRAM (Dynamic Random Access Memory) type memory made up of dynamic memory locations. A DRAM includes elementary cells which are read and written to individually. These cells are compact since they are generally composed of a transistor and a capacitor. They have a short access time, typically about 40 to 60 ns, but the stored information must be frequently refreshed.

A second type is an SRAM (Static Random Access Memory) type memory made up of static memory locations. An SRAM includes elementary cells which are addressed both in a read mode and in a write mode. Moreover, they have a short cycle time with access times of about 6 to 70 ns. Furthermore, they retain the information as long as they are supplied power. However, these cells remain limited by their low density, since in general, they are made up of six transistors.

A third type is known as non-volatile memories, for example, flash memories which can retain information for several years within a floating gate which is electrically isolated, for example, by oxide, and do so without being refreshed or supplied. This type of memory is compact since the cells of which they are composed are in general formed from a single transistor. However, the write mechanism, based on the tunnel effect through the isolation oxide of the floating gate, is slow and requires high bias voltages. This results in access times possibly as long as one millisecond. Moreover, these cells cannot typically be addressed for the purpose of erasing them.

SUMMARY OF THE INVENTION

In view of the foregoing background, an object of the present invention is to provide an integrated semiconductor memory device offering hybrid performance by combining the performance of a conventional flash cell with that of a conventional DRAM cell, while overcoming their respective limitations.

Another object of the present invention is to provide a memory location which is erase/write addressable, while having the compactness of a single transistor. Moreover, the read/write mode of the memory location according to the present invention furthermore allows an information access time of a few nanoseconds, since writing to the cell uses transfer mechanisms based on so-called "drift" currents which are much more rapid than the tunnel effect used in flash technology.

The basic principle of the invention relies on the confinement of a charge (a negative charge, i.e., electrons, or a positive charge, i.e., holes) in one of the two potential wells separated by a field-effect barrier. The basic structure of the memory device according to the invention is therefore a kind of "isolated switch" having two states. The state depends on which potential well zone has the charge.

In other words, according to a general feature of the invention, the integrated semiconductor memory device comprises an integrated memory location structure having an isolating-envelope-embedded semiconductor layer (isolated switch) lying between the source region and the drain region of a transistor, and inserted between the channel region of the transistor and its control gate. This isolated semiconductor layer includes two potential well zones separated by a potential barrier zone lying beneath the control gate of the transistor.

The semiconductor memory device according to the invention may also comprise write means or write circuitry for biasing the memory location structure so as to confine charge carriers selectively in one of the two potential well zones.

The device may also comprise read means or read circuitry for biasing the memory location structure so as to detect the presence of charge carriers in one of the potential wells, and thus allows the logic 0 or logic 1 state of the switch to be detected. This detection can take place in various ways, for example, simply by measuring the drain current of the transistor and consequently, indirectly measuring the threshold voltage of the device. This is because the position of the charge carriers in one of the potential wells exerts an electrical effect on the transistor drain current sufficient to distinguish the two states, i.e., logic 0 and logic 1, in the read mode.

In a first variation of the invention, the isolated semiconductor layer may include a central zone having the same type of conductivity (for example, p-type conductivity) as that of the source and drain regions of the transistor (for example, a PMOS transistor). This central zone forms the potential barrier zone. The isolated semiconductor layer also includes two outer zones lying respectively on either side of the central zone, and having the same type of conductivity but different from that of the central zone. These two outer zones may, for example, be n-doped and respectively form the two potential well zones.

In another variation of the invention, the isolated semiconductor layer may be undoped, formed for example, from intrinsic silicon. The memory location structure then includes two auxiliary gates placed respectively on either side of the control gate of the transistor. These two auxiliary gates are isolated from this control gate and have the same type of conductivity, but different from that of the control gate. Thus, if the control gate is $p^+$-doped, the two auxiliary gates will be $n^+$-doped. The two potential well zones lie beneath the two auxiliary gates and are electrostatically induced by the latter, whereas the potential barrier zone is electrostatically induced by the control gate.

According to one embodiment of the invention, and regardless of the variation used, the write means may bias the control gate and the source and drain electrodes to confine charge carriers selectively in one of the two potential well zones. More specifically, according to one embodiment, the write means may bias the source or drain electrode to confine the charge carriers, then bias the control gate to eliminate the potential barrier between the two potential wells, then in unbiasing the control gate and finally in unbiasing the electrode. Thus, the write means allow the charge carriers, for example, electrons, to pass from one electrode to the other.

According to one embodiment of the invention, the read means may bias the control gate, and if necessary, the two auxiliary gates with a bias voltage opposite to that used by the write means. The subject of the invention is also an integrated circuit comprising at least one integrated memory device as defined above.

The invention also provides a process for fabricating an integrated semiconductor memory device, comprising the fabrication of an MOS transistor, and the fabrication of an isolating-envelope-embedded semiconductor layer lying between the source and drain regions of the transistor and inserted between the channel region of the transistor and its control gate. This isolated semiconductor layer may include two potential well zones separated by a potential barrier zone lying beneath the control gate of the transistor.

According to a first variation of the invention, the fabrication of the isolated semiconductor layer comprises an epitaxial growth on a silicon substrate having a first type of conductivity, of a first layer formed from a material selectively removable with respect to silicon, for example, a silicon-germanium alloy. An epitaxial growth is on the first layer and includes a silicon semiconductor second layer having a second type of conductivity. A surface isolating layer may be formed on the second layer.

Moreover, the fabrication of the transistor comprises the production, on the surface isolating layer, of a semiconductor region for the control gate having the second type of conductivity.

The fabrication of the isolated semiconductor layer (isolated switch) furthermore comprises the implantation of dopants in the semiconductor second layer on either side of the gate region to form, in this semiconductor second layer, a central zone having the same type of conductivity as that of the source and drain regions of the transistor and forming the potential barrier zone. Two outer zones lie respectively on either side of the central zone, and have the same type of conductivity but different from that of the central zone, and respectively form the two potential well zones.

The fabrication further includes the etching of the surface isolating layer, the semiconductor second layer, the first layer and part of the substrate, on either side of the gate region flanked by isolating spacers. The first layer is selectively removed to form a tunnel, and the tunnel is filled with an insulating material. The fabrication also includes the formation of a lateral isolating layer on the sidewalls of the semiconductor second layer.

The filling of the tunnel may take place by conformal deposition of oxide. Moreover, the formation of the lateral isolating layer may comprise silicon oxidation followed by anisotropic plasma etching of the oxide thus formed.

According to one method of implementing the invention, the fabrication of the transistor includes the epitaxial growth of the source and drain regions in the substrate on either side of the laterally isolated semiconductor second layer (isolated switch).

According to another variation of the invention, compatible with a double-gate device, the fabrication of the isolated semiconductor layer comprises the epitaxial growth, on a silicon substrate having a first type of conductivity, of a first layer formed from a material selectively removable with respect to silicon, for example, a silicon-germanium alloy. The fabrication also includes the epitaxial growth, on the first layer, of an undoped silicon semiconductor second layer, and the formation of a surface isolating layer on the second layer.

Moreover, the fabrication of the transistor includes the production, on the surface isolating layer, of a semiconductor control gate region having a second type of conductivity.

The fabrication of the isolated semiconductor layer furthermore includes the formation of two auxiliary gates placed respectively on either side of the control gate of the transistor. These auxiliary gates are isolated from this control gate and have the same type of conductivity but different from that of the control gate. The two potential well zones lie beneath the two auxiliary gates and are induced electrostatically by the latter, whereas the potential barrier zone is induced electrostatically by the control gate.

The fabrication may also include etching of the surface isolating layer, the semiconductor second layer, the first layer and part of the substrate, respectively on either side of the assembly formed by the control gate and the two auxiliary gates which are flanked by isolating spacers. The first layer is selectively removed to form a tunnel, and the tunnel is filled with an insulating material. A lateral isolating layer is formed on the sidewalls of the semiconductor second layer.

The formation of the control gate and the formation of the two auxiliary gates comprise, for example, the deposition of a layer of a first semiconductor gate material having a second type of conductivity, for example p-type; the anisotropic etching of the layer of gate material so as to form a block; and the formation of two symmetrical lateral recesses in the block. An isolating layer is formed on the walls of the recesses, and the two recesses are filled, and are coated with the isolating layer with a second gate material having the first type of conductivity, for example, n-type.

The auxiliary gates formed in this way are consequently self-aligned with respect to the control gate. The formation of the lateral recesses comprises, for example, thermal oxidation of the block followed by wet etching of the oxide formed. Again, in this variation, the filling of the tunnel may be carried out by conformal deposition of oxide, whereas the formation of the lateral isolating layer may be carried out by silicon oxidation followed by anisotropic plasma etching of the oxide. The fabrication of the transistor may also include in this variation the epitaxial growth of the source and drain regions in the substrate on either side of the laterally isolated semiconductor second layer.

In another variation of the invention, also compatible with a device having two control gates, the isolated semiconductor layer may result from deposition on an insulating layer obtained, for example, by thermal oxidation of the substrate. More specifically, according to such a variation, the fabrication of the isolated semiconductor layer comprises the formation of an isolating first layer on a silicon substrate having a first type of conductivity; the deposition of an undoped semiconductor second layer on the isolating first layer; and the formation of a surface isolating layer on the second layer.

The fabrication of the transistor again includes the production, on the surface isolating layer, of a semiconductor control gate region having a second type of conductivity. The fabrication of the isolated semiconductor layer (isolated switch) may furthermore include the formation of two auxiliary gates placed respectively on either side of the control gate of the transistor. These auxiliary gates are isolated from this control gate and have the same type of conductivity but different from that of the control gate. The two potential well zones lie beneath the two auxiliary gates and are induced electrostatically by the latter, whereas the potential barrier zone is induced electrostatically by the control gate.

The fabrication also includes etching of the surface isolating layer and the semiconductor second layer, respectively on either side of the assembly formed by the control gate and the two auxiliary gates which are flanked by isolating spacers. A lateral isolating layer is formed on the sidewalls of the semiconductor second layer.

According to one method of implementation compatible with this variation, the fabrication of the transistor may include the anisotropic etching of the isolating first layer on either side of the isolated semiconductor layer to expose the substrate, and the epitaxial growth of the source and drain regions in the substrate on either side of the laterally isolated semiconductor second layer (isolated switch).

BRIEF DESCRIPTION OF THE DRAWINGS

Further advantages and features of the invention will become apparent on examining the detailed description of embodiments and methods of implementation, these being in no way limiting, and the appended drawings in which:

FIGS. 2a to 2d illustrate schematically the two possible states of an isolated switch of a memory device according to the present invention;

FIG. 3 illustrates diagrammatically the configuration of the memory device in FIG. 1 allowing a first logic state, for example, a logic 0 state to be stored;

DETAILED DESCRIPTION OF THE PREFERRED EMBODIMENTS

Figure 1:
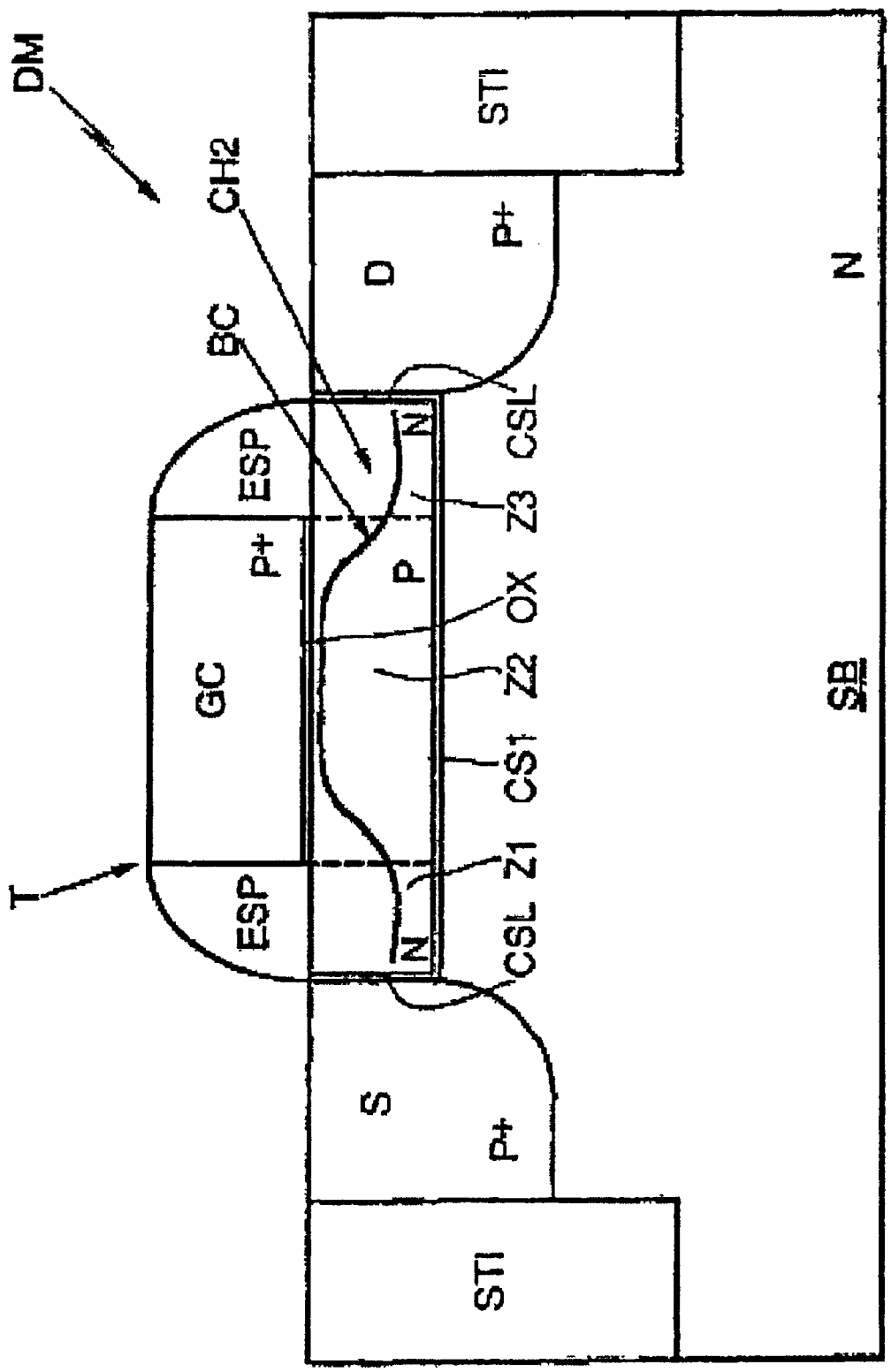
FIG. 1 illustrates diagrammatically a first embodiment of a memory device according to the present invention.

In FIG. 1, the reference DM denotes an integrated semiconductor memory device. By way of example throughout the following discussion, the transistor of the memory device will be a PMOS transistor and the isolated switch will be an NPN-type switch.

The reference SB denotes a semiconductor substrate, for example, made of n-doped silicon. In an active substrate zone bounded by lateral isolation zones STI, for example, of the shallow trench type, the device DM has an isolated semiconductor layer CH2, also referred to by the name "isolated switch". This isolated switch CH2 is inserted between the control gate GC of a PMOS transistor, labeled T, and the conduction channel of this transistor which extends between the source region S and the drain region D.

The isolated switch CH2 comprises a semiconductor layer having a central zone Z2 of p-type conductivity and two outer zones Z1 and Z3 of n-type conductivity, which is obtained, for example, by $n^+$-doping. As a result, the band structure, in this case the conduction band BC, has two potential well zones lying within the zones Z1 and Z3 respectively, separated by a potential barrier zone lying within the zone Z2 beneath the gate GC of the transistor. This band structure allows an electrical charge to be confined above the conduction channel near the source or the drain, as will be explained in detail below.

Physically, this semiconductor layer of the isolated switch is isolated from the conduction channel by a lower isolating layer CS1. It is isolated laterally from the source and drain regions by lateral isolating layers CSL. Finally, it is isolated from the control gate GC by the gate oxide layer OX, and by the isolating spacers ESP which lie on either side of the control gate GC. Moreover, in the direction orthogonal to the plane of FIG. 1, the semiconductor layer of the switch is isolated by the isolation region STI.

Before the memory cell DM is used for the first time, the floating zone (isolated switch) must be depleted of holes, for example, by a large negative bias of the control gate GC, and charged with electrons by suitably biasing the source and drain. Biasing the gate and the source and drain electrodes allows electrons to be transferred from one well in the conduction band to the other, and thus modify the threshold voltage of the transistor. In other words, these various bias voltages form write means for writing (storing) in the memory cell a logic state 0 or a logic state 1 according to whether the electrons are in one potential well or the other.

For this purpose, reference is directed more particularly to FIGS. 2a to 2d which illustrate the charge transfer that takes place according to the read procedure of the invention. In FIG. 2a, it is assumed that the charge carriers, in this case electrons e, are located in the potential well zone lying to the left (in FIG. 2a) of the potential barrier. The gate bias voltage $V_g$ is zero and the drain-source voltage difference $V_{ds}$ is zero.

The source or drain electrode at which it is desired to transfer the charge is then positively biased (FIG. 2b). The band structure BC is then bent by the field effect. The control gate is then positively biased enough to eliminate the potential barrier between the two wells (FIG. 2c). The electrons then flow towards the conduction band minimum. Next, the gate is unbiased so as to restore the potential barrier. When the drain-source bias is removed, the electrons then remain confined on the side to which they were switched (FIG. 2d).

Let us assume, for example, that electrons confined on the drain side correspond to a stored logic state 0, while electrons confined on the source side correspond to a stored logic state 1. The effect of placing the charges above the threshold voltage is described with reference to FIGS. 3 and 4 for reading a logic state 0 and a logic state 1 respectively.

When reading the cell, the gate of the device is negatively biased. This negative bias makes it possible to attract electrons into the gate close to its interface with the oxide OX, and consequently invert the channel (which is n-doped). If we first consider FIG. 3, which illustrates the reading of a logic state 0, the free electrons e in the switch are near the drain D. Three population levels may then be distinguished beneath the switch.

A first level is referred to as the central zone ZZ2. Above this zone, the zone Z2 is permanently depleted and contains fixed negative charges (ionized acceptors) which, even with no gate bias, attract holes in the zone ZZ2 of the channel. The threshold voltage associated with this zone ZZ2, denoted VthA, is therefore below the threshold voltage that a similar architecture with the depleted intrinsic switch would have.

A second level is referred to as the zone ZZ1. Above this zone, the depleted $n^+$-doped switch contains many fixed positive charges (ionized donors) which retard the inversion passage of the zone ZZ1. In addition, this zone, lying beneath the spacer ESP, is offset with respect to the gate. Consequently, the capacitive effect of the gate on the channel is therefore lower there than in the zone ZZ2. As a consequence, a high gate voltage must be applied so that the gate electrons compensate for the effect of the fixed charges in the switch, and cause inversion of the channel. The threshold voltage associated with this zone ZZ1 will therefore be above the threshold voltage which a similar architecture with the depleted intrinsic switch would have. This threshold voltage is denoted VthB and is greater in absolute value than the absolute value of the threshold voltage VthA.

A third level is referred to as the zone ZZ3. This zone is symmetrical with the zone ZZ1. However, confinement of the free electrons in that part of the switch overhanging this zone must be taken into account. This negative moving charge goes in the direction of an increase in the channel inversion. The threshold voltage associated with this zone, denoted VthC, will therefore be such that:

$$|VthA|<|VthC|<|VthB|.$$

The device DM may consequently be regarded as a series of three PMOS transistors having different threshold voltages between a source electrode and a drain. The threshold voltage of the memory device DM will consequently be defined by the highest of these voltages. This is because as long as the gate voltage Vg is smaller in absolute value than the absolute value of the threshold voltage VthB, there will be no injection of holes into the channel, and therefore no drain current. For reading a logic state 0, the threshold voltage of the device is therefore VthB.

If the switch is in a logic state 1, as illustrated in FIG. 4, there are again three inversion zones associated with the three threshold voltages mentioned above. However, this time, the highest threshold voltage zone is close to the drain, that is, the zone ZZ3. For sufficient drain-source bias, the carriers reach saturation beneath the gate and are then defocused as far as the drain. Under these conditions, the channel zone close to the drain, that is, the zone ZZ3, has not been inverted so that the transistor conducts. The threshold voltage of the memory device is then the higher of the threshold voltage of the zone ZZ1 and the threshold voltage of the zone ZZ2. This is that of the zone ZZ1, i.e., the voltage VthC, i.e., the threshold voltage associated with the zone overlaid with free electrons.

Furthermore, the absolute value of this threshold voltage VthC is in this case smaller than the absolute value of the threshold voltage VthB, which was the threshold voltage of the memory in a logic state 0. Consequently, the threshold voltage of the device varies with the state of its switch. We therefore clearly have a memory cell. To read this cell the drain current will therefore be measured, giving an image of the threshold voltage of the device, and consequently of the state of the memory.

Figure 5:
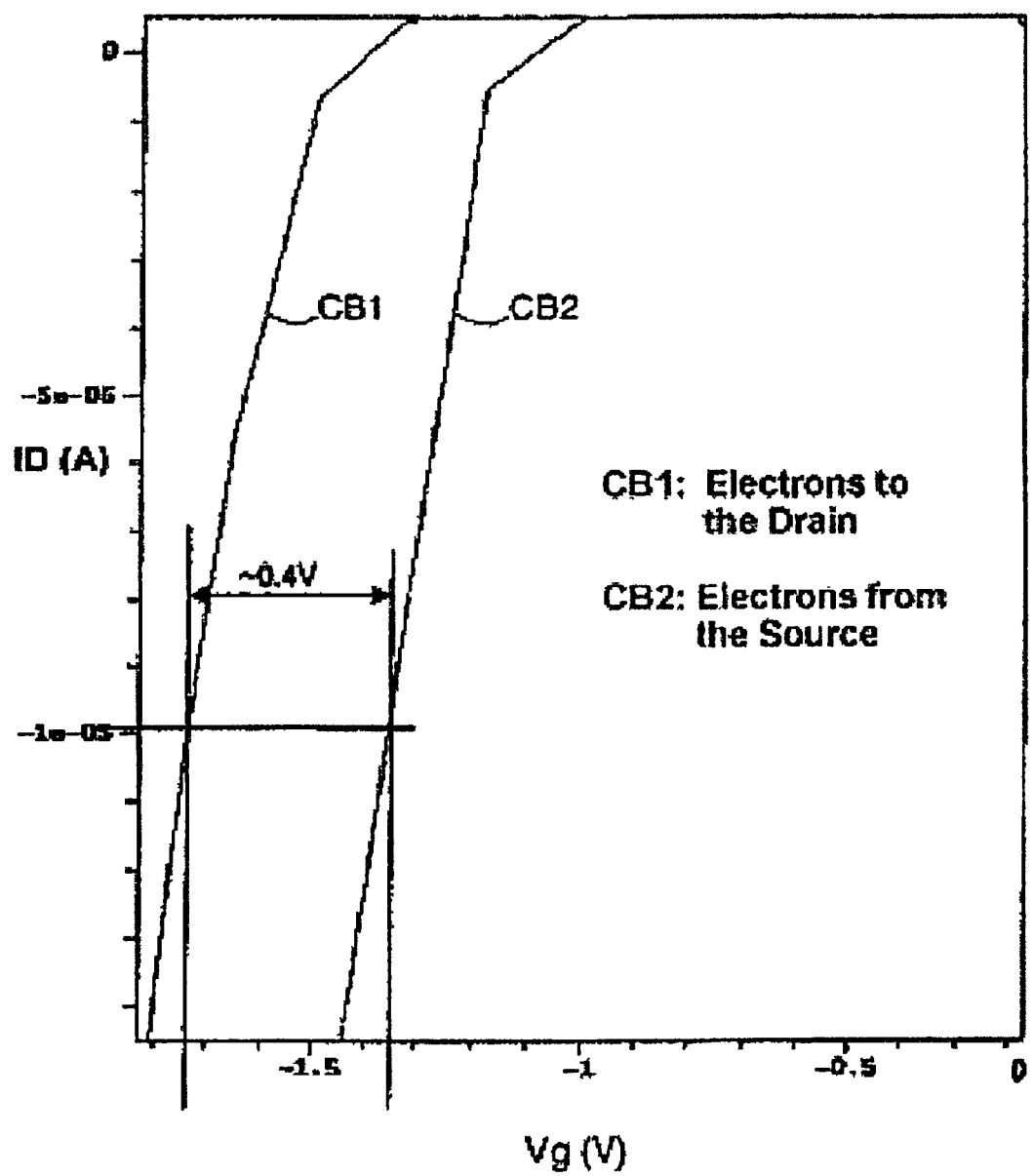
FIG. 5 is a graph illustrating the measured drain current of the transistor in each of the possible storage configurations of the memory device according to the present invention.

FIG. 5 illustrates two drain current curves plotted as a function of the gate voltage Vg. Curve CB1 corresponds to a cell in the logic state 0 (electrons in the drain), while curve CB2 corresponds to a cell in the logic state 1 with electrons in the source. The figure therefore shows this variation in the threshold voltage of the transistor according to the position of the charges. Threshold voltage differences of about 200 to 400 mV for a drain current of 100 mA have been observed. This kind of characteristic is very suitable for memory-type applications.

Figure 12:
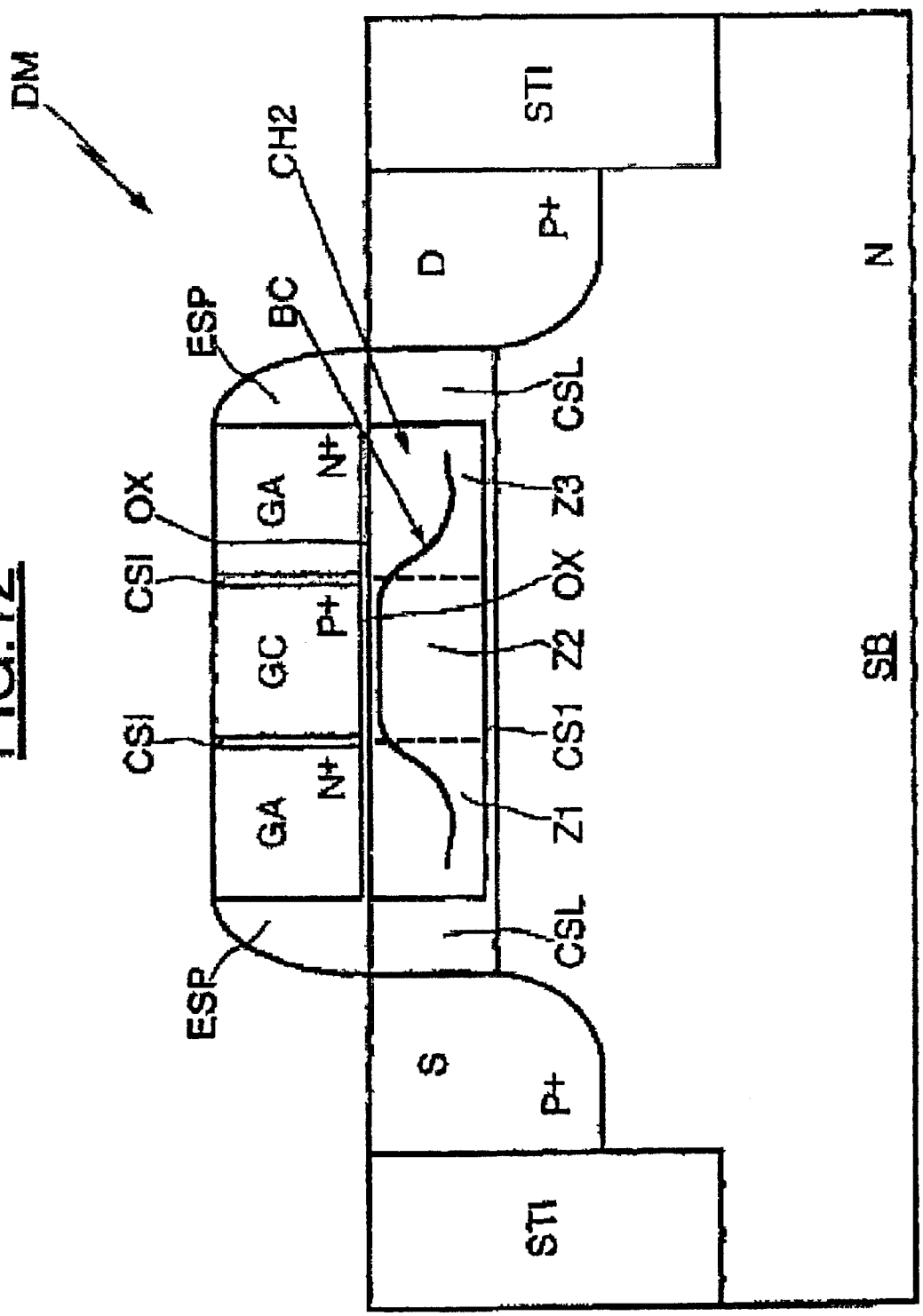
FIG. 12 illustrates a second embodiment of a memory device according to the present invention.

In the embodiment illustrated schematically in FIG. 12, the band structure BC within the floating zone is electrostatically induced by the p$^+$-doping of the control gate GC of the pMOS transistor, and by the n$^+$-doping of two auxiliary gates GA which are isolated from the control gate GC by an isolating layer CSI and lie respectively on either side of this control gate GC. In FIG. 12 the elements similar to or having functions similar to those illustrated in FIG. 1 have been shown with the same references.

The electronic charge is introduced, upon first using the cell, by the tunnel effect through the gate oxide OX by applying a high positive bias to the auxiliary gate. The duration of the tunnel charging must be long enough to charge each of the potential wells Z1 and Z3 with an electron density of about $5 \times 10^{18}$ cm$^{-3}$.

Charge transfer is achieved in a way similar to that described with reference to FIGS. 2a–2d. To lower the potential barrier (FIG. 2c), the control gate GC is positively biased with a high enough voltage, for example, about 1 volt, while the auxiliary gate has a zero bias.

Figure 13:
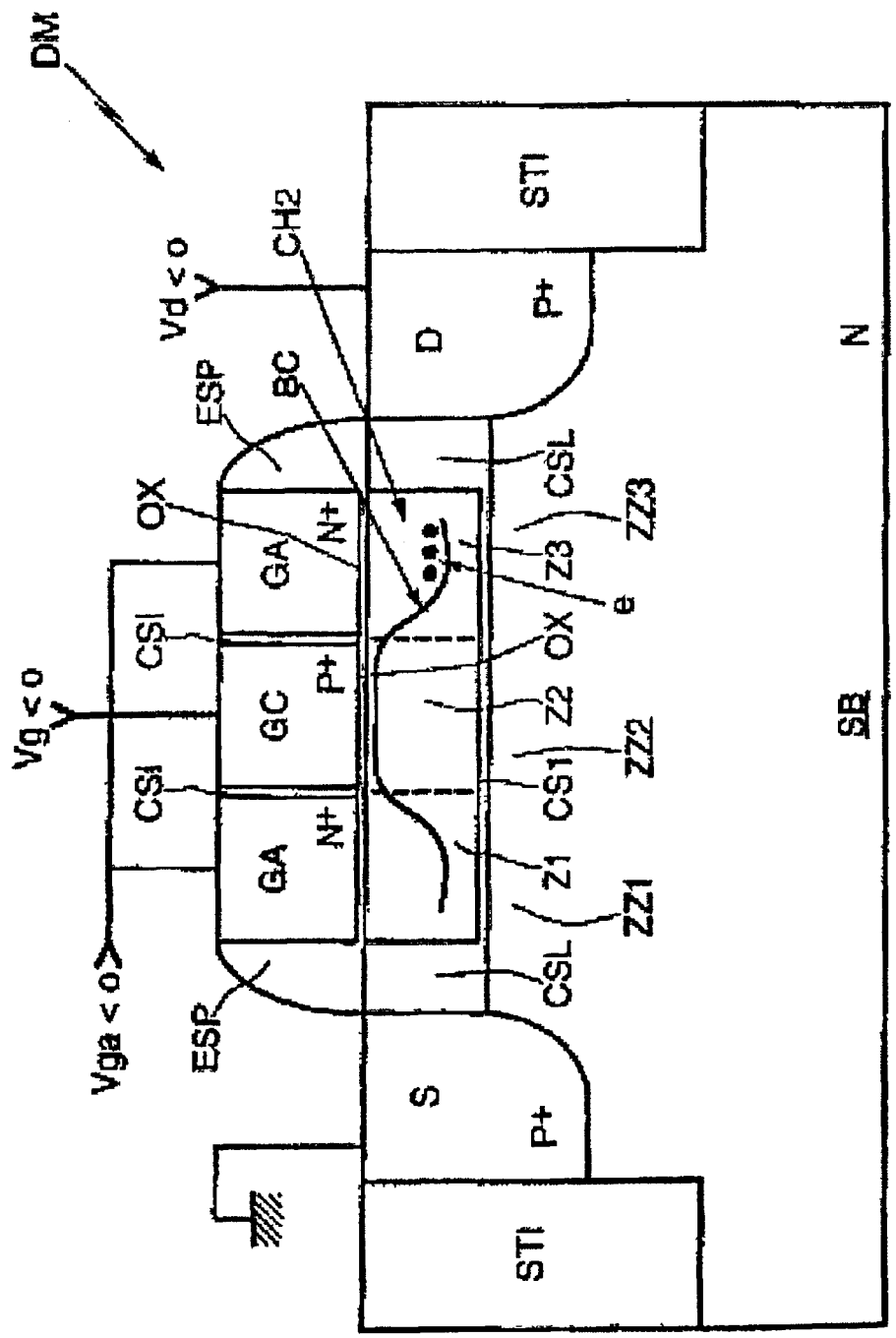
FIGS. 13 and 14 illustrate the two possible storage configurations of the memory device illustrated in FIG. 12.
Figure 14:
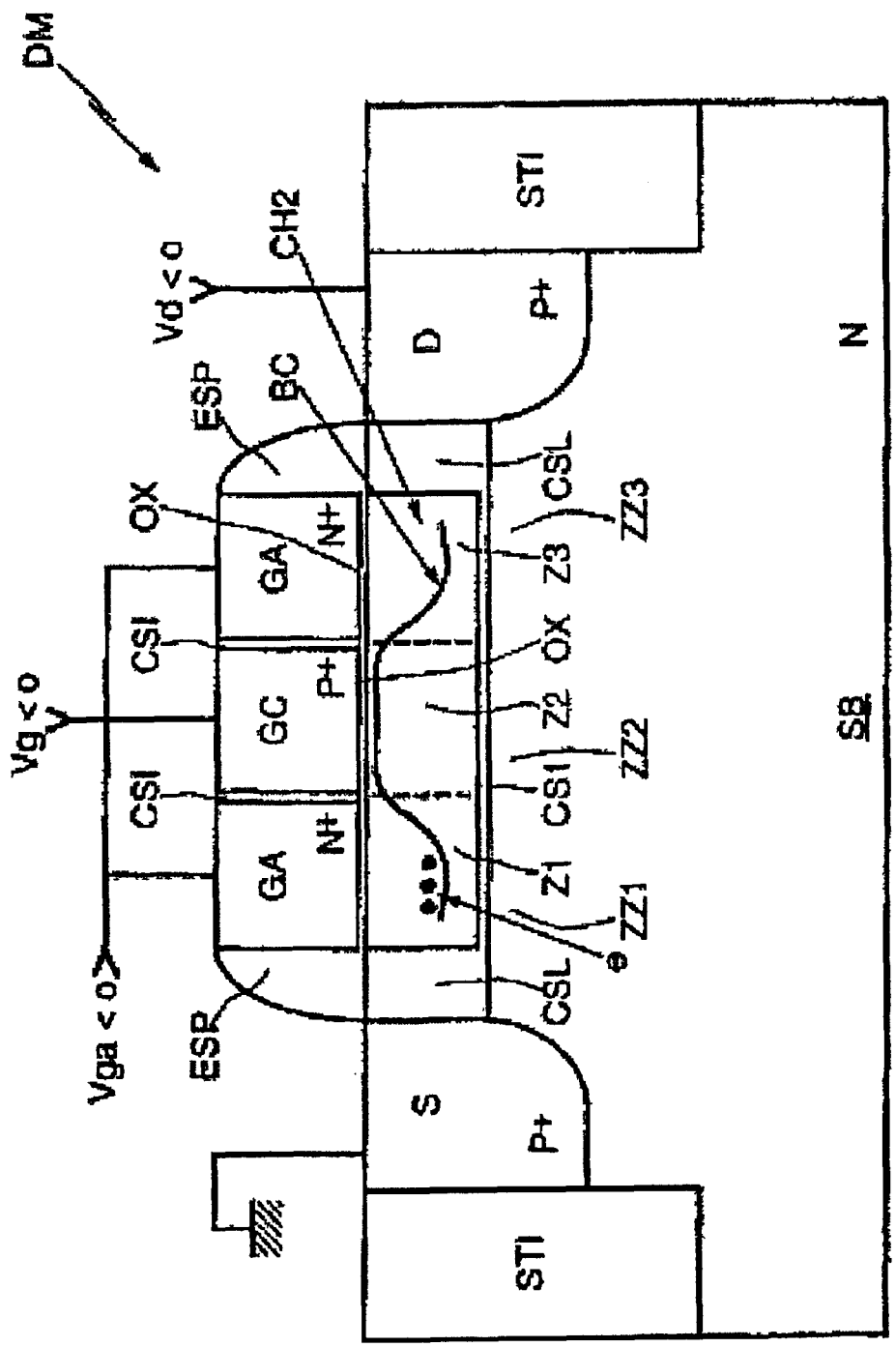

Reference will now be made more particularly to FIGS. 13 and 14 to describe the effect of the position of the charges on the threshold voltage when reading a logic state 0 (FIG. 13) or a logic state 1 (FIG. 14). To read the cell, the control gate and the auxiliary gates are negatively biased, for example, with equal bias voltages.

When the switch is in the logic state 0 (FIG. 13), three population levels beneath the switch may again be distinguished. Two levels are in zones ZZ1 and ZZ3. The n$^+$-doped auxiliary gate, even when biased, induces only weak inversion within the channel. However, the presence of the electronic charge above the zone ZZ3 also helps to attract holes into this zone. The threshold voltage, that is, the threshold voltage for which the channel switches to strong inversion, will therefore be lower by a few hundred millivolts in the zone ZZ3 than in the zone ZZ1. A third level is in zone ZZ2. This portion of the channel is directly exposed to the influence of the potential of the p$^+$-doped gate. For a given gate bias (Vga=Vgc), the p$^+$-doped control gate GC induces a surface potential within the cannel which is about 1 volt less than that imposed by the n$^+$-doped auxiliary gate. The threshold voltage beneath the gate GC is therefore about 1 volt lower than that associated with the zone ZZ3.

Consequently, the device may again be considered as a series of three PMOS transistors having different threshold voltages between a source electrode and a drain. The threshold voltage of the device will be defined by the highest of these voltages. As in the case of the embodiment described previously, for reading the logic state 0 the highest threshold voltage is that of the zone ZZ1.

If the switch is in the logic state 1 (FIG. 14), there are again three inversion zones ZZ1, ZZ2 and ZZ3 associated with the three abovementioned threshold voltages. However, this time the zone with the highest threshold voltage is close to the drain. Now, for sufficient drain-source bias, the carriers reach saturation beneath the control gate and are then defocused as far as the drain. Under these conditions, the third zone ZZ3 does not have to be in an inversion mode for the transistor to conduct. The threshold voltage of the device DM is therefore the higher of that of the zone ZZ1 and that of the zone ZZ2. This is the threshold voltage associated with the zone ZZ1. Furthermore, this voltage is lower than the threshold voltage of the switch in logic state 0.

Figure 6:
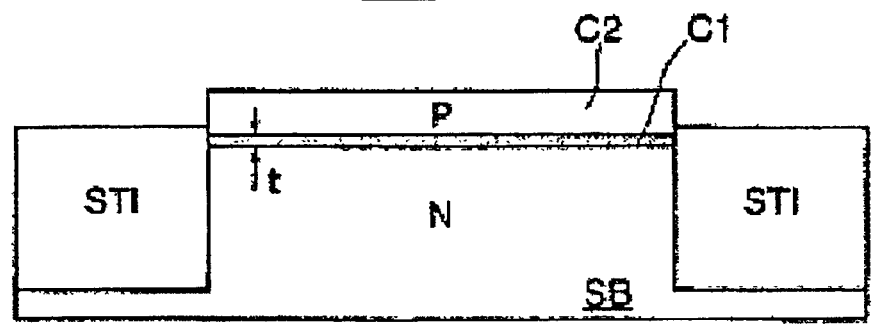
FIGS. 6 to 11 illustrate schematically the main steps of a first method of implementing a process for fabricating a memory device according to the present invention.

A description will now be given, with reference more particularly to FIGS. 6 to 11 of the main steps of one method of implementing a fabrication process according to the invention for obtaining a memory location device like that illustrated in FIG. 1. In FIG. 6, the reference SB denotes an n-type semiconductor substrate, for example, made of silicon, having an active zone bounded by lateral isolation regions STI, for example, regions of the shallow trench isolation type.

The process begins by epitaxial deposition of a first layer C1 formed from a silicon-germanium alloy $Si_{1-x}Ge_x$ with, for example, x>20%. The thickness t of this first layer C1 defines the thickness of the lower isolating layer of the isolated switch. Next, a p-doped silicon semiconductor second layer C2 is epitaxially deposited on the first layer C1. It is within this second layer C2 that the floating switch will be formed. The thickness of this second layer C2 is on the order of a hundred angstroms.

Next, a third layer C3 is formed, for example, by thermal growth, on the second layer C2. This layer C3 is, for example, made of silicon dioxide and will form not only the upper isolating layer of the floating switch but also the gate oxide layer of the transistor. Next, a layer of a gate semiconductor material is deposited, for example polysilicon p$^+$-doped in situ. A nitride layer serving as a hard mask MS is then deposited. After the hard mask and the layer of gate material have been etched, the structure obtained is that in FIG. 7, in which the reference GC denotes the future control gate of the transistor.

Next (FIG. 8), a low-energy n+-implantation operation is carried out on either side of the gate GC so as to form the outer zones of the isolated switch. This implantation is carried out with a low energy in such a way that the implanted zone does not exceed the silicon thickness of the second layer C2. Spacers ESP, for example, made of silicon nitride, are then formed around the gate GC in a conventional manner.

Next (FIG. 9), the surface isolating layer C3, the semiconductor second layer C2, the first layer C1 and part of the substrate SB are then anisotropically etched on either side of the gate GC flanked by the spacers ESP to form recesses EV. The first layer C1 is then selectively removed so as to form a tunnel.

In this regard, although a silicon-germanium alloy has been mentioned as an example, the selectively removable material forming the layer C1 may be any material selectively removable with respect to silicon which, preferably, ensures that there is lattice continuity with the silicon of the substrate during the epitaxy. $Si_{1-x}Ge_x$ alloys are recommended since they are easy to remove selectively, either by a well-known oxidizing chemistry (such as a solution containing 40 ml of 70% $HNO_3$+20 ml of $H_2O_2$+5 ml of 0.5% HF) or by isotropic plasma etching.

Preferably, $Si_{1-x}Ge_x$ alloys having a high germanium content will be used as the etching selectivity with respect to silicon increases with increased germanium content in the alloy. It is also possible to use $Si_{1-x-y}Ge_xC_y$ alloys (with $0<x\leq0.95$ and $0<y<0.05$) which behave like $Si_{1-x}Ge_x$ alloys with regards to selective removal but which induce less strain with the silicon layers.

Figure 10:
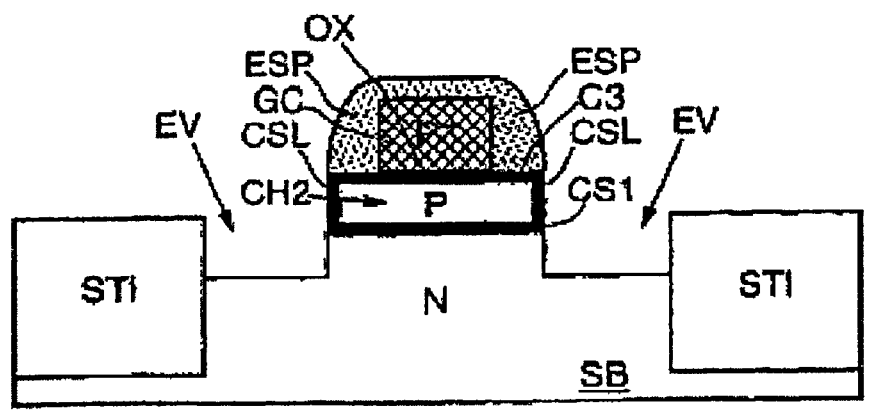

The tunnel formed is then filled with oxide by conformal deposition to form the lower isolating layer CS1 (FIG. 10). Anisotropic plasma etching of the oxide then allows part of the sidewalls of the floating zone and the bottom walls of the recesses to be cleaned to allow, as will be seen in further detail below, the source and drain regions to be epitaxially grown. This anisotropic plasma etching also allows the oxide deposited in the tunnel to be retained.

Figure 11:
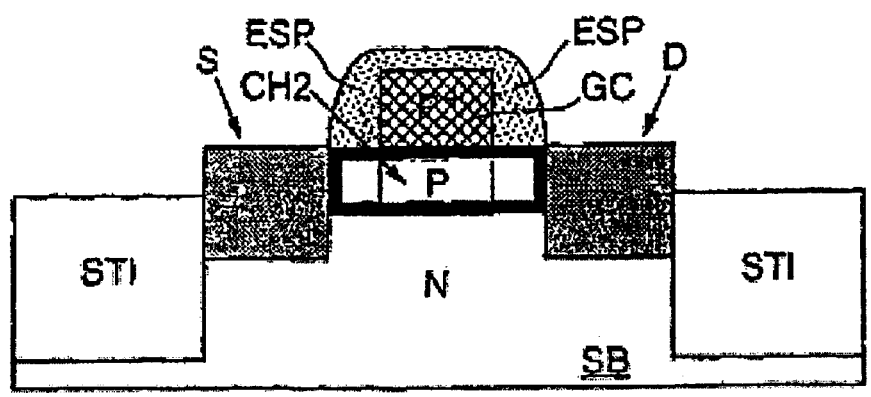

The sidewalls of the floating zone (isolated switch) now have to be isolated while retaining the silicon surface of the source and drain regions for the purpose of their epitaxy. In this regard, it is possible to use the high anisotropy of the oxide plasma etching. More specifically, the silicon, which in the sidewalls of the floating zone extends beneath the nitride spacers ESP, is first oxidized. The spacers will therefore protect about ⅓ of the oxide formed in the silicon from the anisotropic etching which opens up access to the source and drain regions. The thickness of the lateral isolating oxide of the floating zone CSL is defined here by the thickness of the oxidation (FIG. 10). The source and drain regions S and D are then grown epitaxially and p+-doped in situ. The final structure is illustrated in FIG. 11.

The main steps of a second method of implementing the process according to the invention, allowing a memory device like the one illustrated in FIG. 12 to be obtained, will now be described more particularly with reference to FIGS. 15 to 20. Here again, the process starts by the epitaxial growth of a semiconductor first layer C1 formed from a material selectively removable with respect to silicon. This material may be a silicon-germanium alloy with a germanium content greater than 20%. Again, the thickness t of the first layer C1 will define the thickness of the lower isolating layer of the isolated switch. The semiconductor second layer C2, which is a layer of intrinsic, i.e., undoped, silicon, is then grown epitaxially to a thickness of about a hundred angstroms on the first layer C1.

Figure 16:
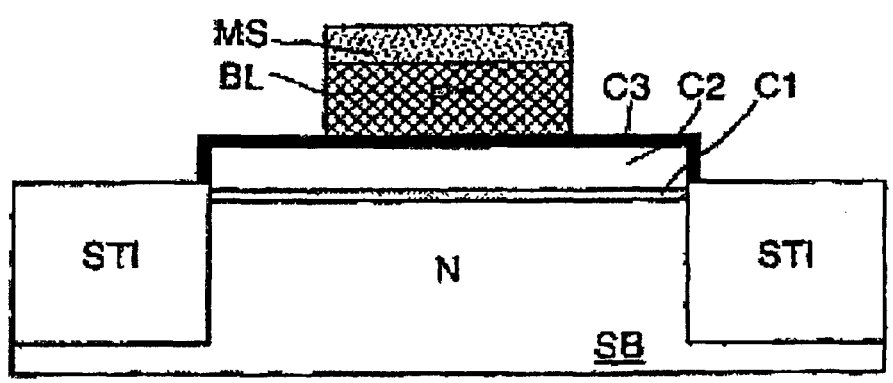

After having formed, for example, by thermal growth, an isolating layer C3 on the upper surface of the layer C2 (FIG. 16), a layer of a gate semiconductor material, for example, polysilicon, p+-doped in situ is deposited. A nitride layer, which will serve as hard mask for the gate etching, is then deposited. After the hard mask MS and the gate material have been etched, a block BL resting on the isolating layer C3 is obtained (FIG. 16).

Next, the block BL must be recessed laterally and symmetrically. For this purpose, a thermal oxidation operation may be carried out, followed by wet etching on the oxide formed. Two lateral recesses are therefore obtained. The lateral recesses are then coated with an isolating layer, for example, a thin nitride layer C4. Another layer of a gate semiconductor material, n+-doped in situ, is deposited so that the recesses coated with the isolating layer are filled. This second gate material layer is anisotropically etched, with the etching stopping on the nitride layer C4. The auxiliary gates GA are thus defined in a self-aligned manner since the hard mask MS of the first etching operation is reused.

Next, isolating spacers ESP, for example, made of silicon nitride, are formed in a conventional manner on either side of the auxiliary gates. The layer C2, the layer C1 and part of the substrate SB are then etched so as to form two recesses EV. Next (FIG. 19), the layer C1 is selectively etched in a manner similar to that described with reference to the first method of implementing the fabrication process according to the invention. The filling of the tunnel and the forming of the lateral isolating layer CSL are also carried out in a manner similar to that described with reference to FIG. 10. The source and drain regions S and D are then formed by in-situ p+-doped silicon epitaxy (FIG. 20).

The method of implementation illustrated in FIGS. 21 to 24 also allows a double-gate memory location device to be obtained. However, the process starts with a thermal oxidation to form an isolating first layer C1 which will define the lower isolation of the isolated switch. In this case, this is the equivalent of the tunnel oxide in the method of implementation described above.

Figure 22:
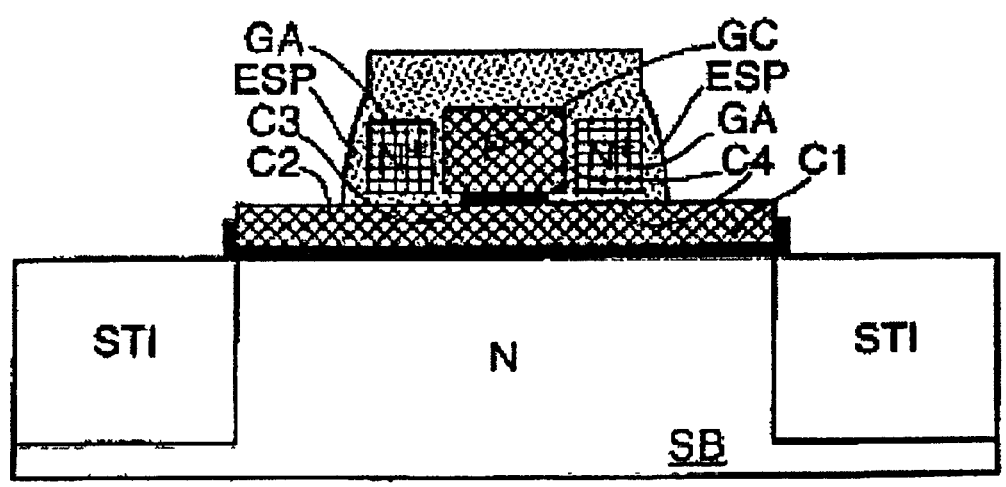

The semiconductor second layer C2 made of polysilicon or undoped amorphous silicon is then deposited. The upper isolation oxide is then deposited followed by the p+-doped gate polysilicon and the nitride hard mask. The formation of the control gate GC and that of the auxiliary gates, as illustrated in FIG. 22, are identical to those described in the previous method of implementation.

Figure 23:
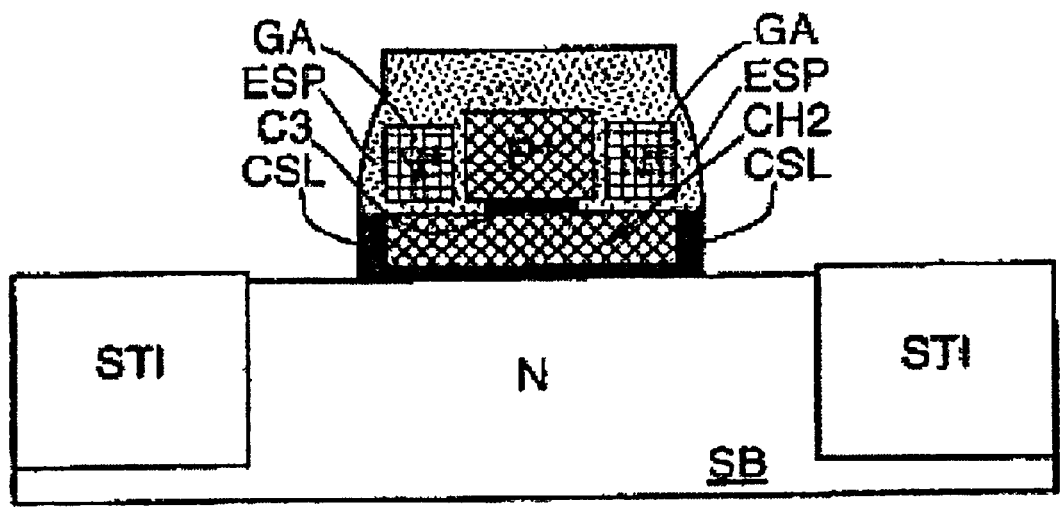
Figure 24:
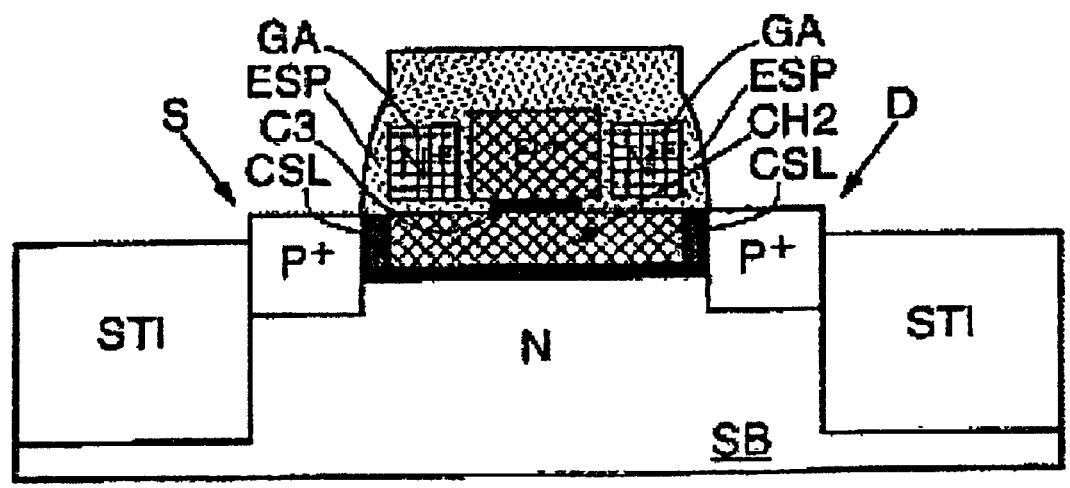

The layer C2 is then anisotropically etched in a self-aligned manner down to the lower oxide C1. The sidewalls are then oxidized. The oxidation penetrates beneath the spacers, like in the previously described method of implementation. Anisotropic etching of the oxide then allows the silicon of the substrate to be reached, while leaving the oxidized sidewalls of the floating zone CH2 (FIG. 23). The process is complete, as previously, with the in-situ p+-doped epitaxy of the source and drain regions. The final structure is illustrated in FIG. 24. Of course, the invention also applies to a PNP switch associated with an NMOS transistor by making changes to the types of conductivity, as readily understood by one skilled in the art.

What is claimed is:

1. A memory device comprising:
    a plurality of memory cells each comprising
        a MOS transistor comprising spaced apart source and drain regions with a channel region defined therebetween, and a control gate overlying the channel region, and
        a semiconductor layer isolated between said source region and said drain region, and between the channel region and said control gate, said semiconductor layer comprising first and second potential well zones and a potential barrier zone between said first and second potential well zones and under said control gate.

2. A memory device according to claim 1, further comprising:
write means for biasing each MOS transistor to selectively confine charge carriers in one of said first and second potential well zones; and
read means for biasing each MOS transistor for detecting the charge carriers confined in one of said first and second potential well zones.

3. A memory device according to claim 2, wherein said write means bias said control gate and said source and drain regions to selectively confine the charge carriers.

4. A memory device according to claim 3, wherein said write means bias said source or drain region corresponding to said first or second potential well zone to receive the charge carriers, and bias said control gate for eliminating a potential barrier between said first and second potential well zones so that said first or second potential well zone receives the charge carriers, and unbias said control gate for restoring the potential barrier, and unbias said source and drain regions for confining the charge carriers.

5. A memory device according to claim 4, wherein said read means bias said central control gate and said first and second auxiliary control gates with a bias voltage opposite to that used by said write means.

6. A memory device according to claim 2, wherein said read means measures a drain current of a respective MOS transistor for detecting the confined charge carriers in a corresponding first or second potential well zone.

7. A memory device according to claim 1, further comprising a semiconductor substrate having a first type of conductivity under said plurality of memory cells; wherein said source and drain regions have a second type of conductivity; and wherein said potential barrier zone has the second type of conductivity and said first and second potential well zones have the first type of conductivity.

8. A memory device according to claim 7, wherein said control gate comprises first and second auxiliary control gates and a central control gate therebetween, said central control gate having the second type of conductivity and the first and second auxiliary control gates having the first type of conductivity and being isolated from said central control gate.

9. A memory device according to claim 8, wherein said first potential well zone is under said first auxiliary control gate and is controlled thereby; wherein said second potential well zone is under said second auxiliary control gate is controlled thereby; and wherein said potential barrier zone is under said central control gate and is controlled thereby.

10. An integrated circuit comprising:
a memory device comprising a plurality of memory cells, each memory cell comprising
a MOS transistor comprising spaced apart source and drain regions with a channel region defined therebetween, and a control gate overlying the channel region, and
a semiconductor layer isolated between said source region and said drain region, and between the channel region and said control gate, said semiconductor layer comprising first and second potential well zones and a potential barrier zone between said first and second potential well zones and under said control gate;
a write circuit for biasing each MOS transistor to selectively confine charge carriers in one of said first and second potential well zones; and
a read circuit for biasing each MOS transistor for detecting the charge carriers confined in one of said first and second potential well zones.

11. An integrated circuit according to claim 10, wherein said read circuit measures a drain current of a respective MOS transistor for detecting the confined charge carriers in a corresponding first or second potential well zone.

12. An integrated circuit according to claim 10, further comprising a semiconductor substrate having a first type of conductivity under said plurality of memory cells; wherein said source and drain regions have a second type of conductivity; and wherein said potential barrier zone has the second type of conductivity and said first and second potential well zones have the first type of conductivity.

13. An integrated circuit according to claim 12, wherein said control gate comprises first and second auxiliary control gates and a central control gate therebetween, said central control gate having the second type of conductivity and the first and second auxiliary control gates having the first type of conductivity and being isolated from said central control gate.

14. An integrated circuit according to claim 13, wherein said first potential well zone is under said first auxiliary control gate and is controlled thereby; wherein said second potential well zone is under said second auxiliary control gate is controlled thereby; and wherein said potential barrier zone is under said central control gate and is controlled thereby.

15. An integrated circuit according to claim 10, wherein said write circuit biases said control gate and said source and drain regions to selectively confine the charge carriers.

16. An integrated circuit according to claim 15, wherein said write circuit biases said source or drain region corresponding to said first or second potential well zone to receive the charge carriers, and biases said control gate for eliminating a potential barrier between said first and second potential well zones so that said first or second potential well zone receives the charge carriers, and unbiases said control gate for restoring the potential barrier, and unbiases said source and drain regions for confining the charge carriers.

17. A memory device according to claim 16, wherein said read circuit biases said central control gate and said first and second auxiliary control gates with a bias voltage opposite to that used by said write circuit.

* * * * *

UNITED STATES PATENT AND TRADEMARK OFFICE
CERTIFICATE OF CORRECTION

PATENT NO. : 6,759,721 B2  
DATED : July 6, 2004  
INVENTOR(S) : Skotnicki et al.

It is certified that error appears in the above-identified patent and that said Letters Patent is hereby corrected as shown below:

Drawings,
Delete FIG. 1 and insert new FIG. 1

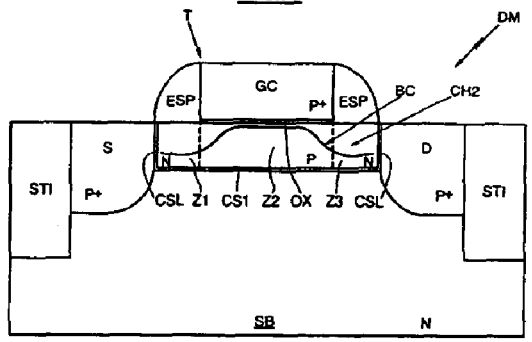

Delete FIGS. 2a-2d and insert new FIGS. 2a-2d

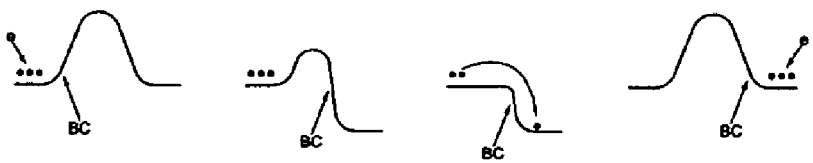

Delete FIG. 3 and insert new FIG. 3

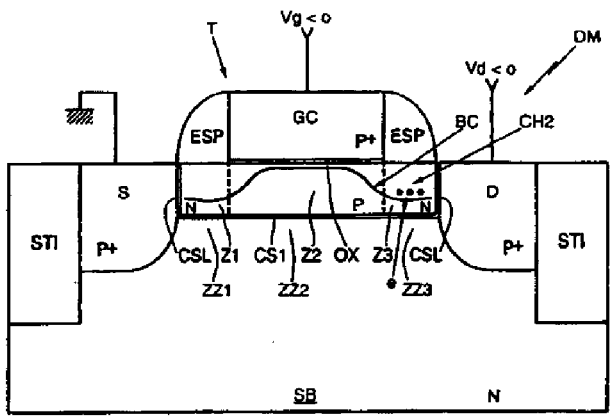

UNITED STATES PATENT AND TRADEMARK OFFICE
CERTIFICATE OF CORRECTION

PATENT NO. : 6,759,721 B2
DATED : July 6, 2004
INVENTOR(S) : Skotnicki et al.

Figure 4:
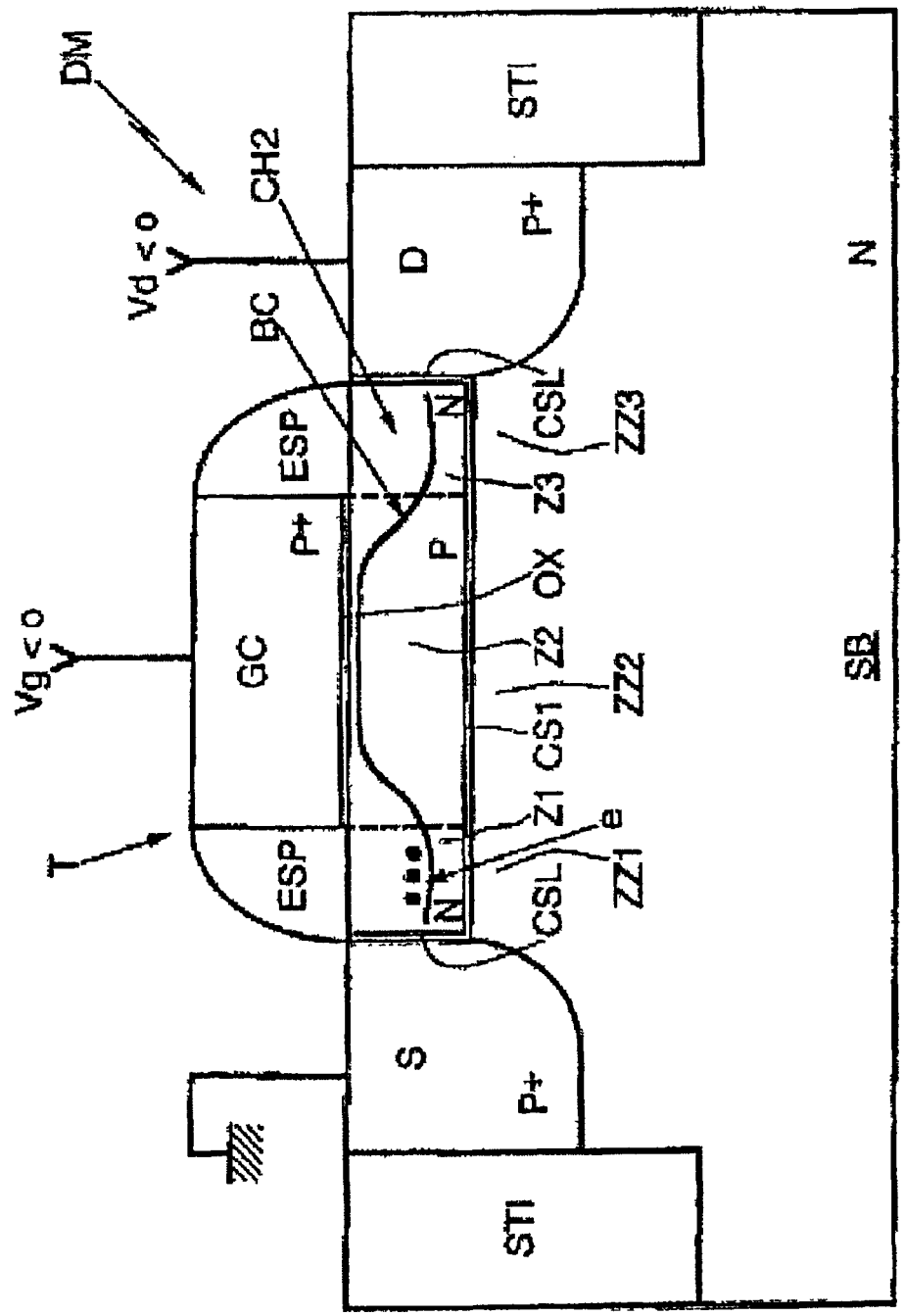
FIG. 4 illustrates a configuration of the memory device in FIG. 1 allowing a second logic state, for example, a logic 1 state to be stored.

It is certified that error appears in the above-identified patent and that said Letters Patent is hereby corrected as shown below:

Drawings (cont'd),
Delete FIG. 4 and insert new FIG. 4

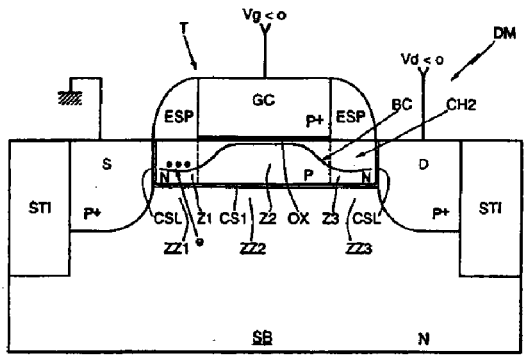

FIG.4

Delete FIG. 5 and insert new FIG. 5

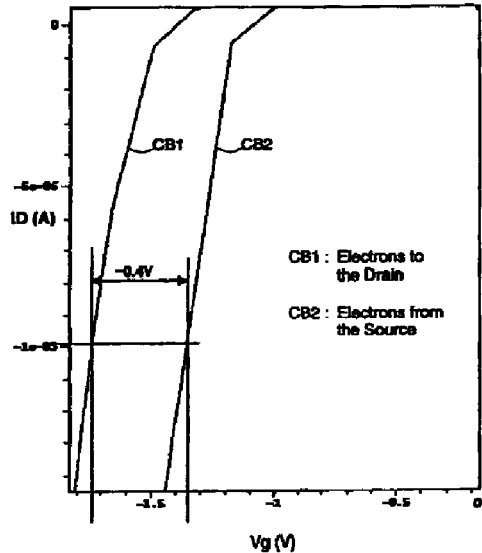

FIG.5

UNITED STATES PATENT AND TRADEMARK OFFICE
CERTIFICATE OF CORRECTION

PATENT NO. : 6,759,721 B2
DATED : July 6, 2004
INVENTOR(S) : Skotnicki et al.

It is certified that error appears in the above-identified patent and that said Letters Patent is hereby corrected as shown below:

Drawings (cont'd),
Delete FIG. 6 and insert new FIG. 6

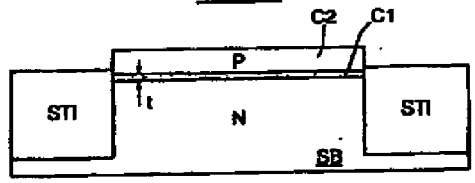

Figure 7:
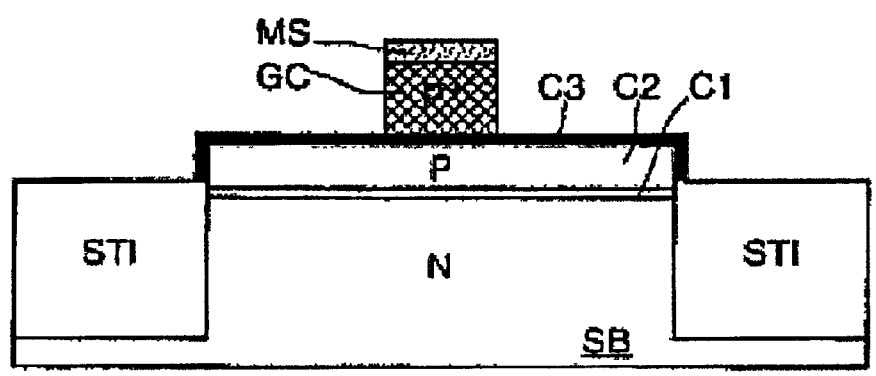

Delete FIG. 7 and insert new FIG. 7

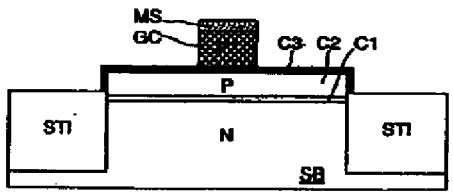

Figure 8:
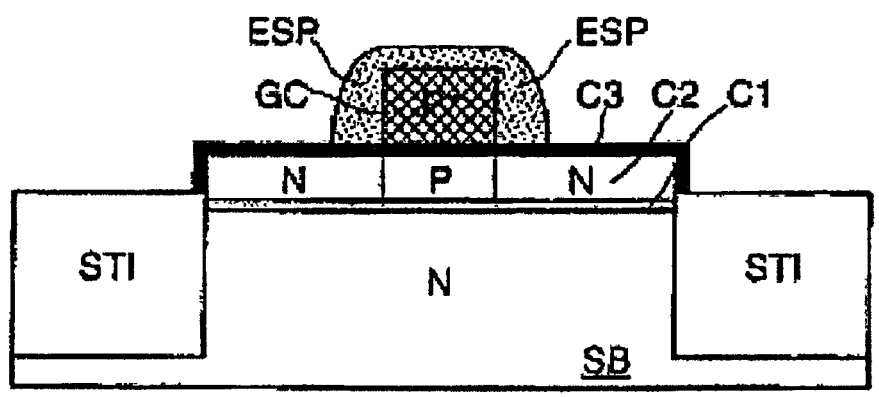

Delete FIG. 8 and insert new FIG. 8

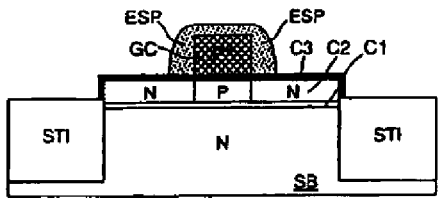

Figure 9:
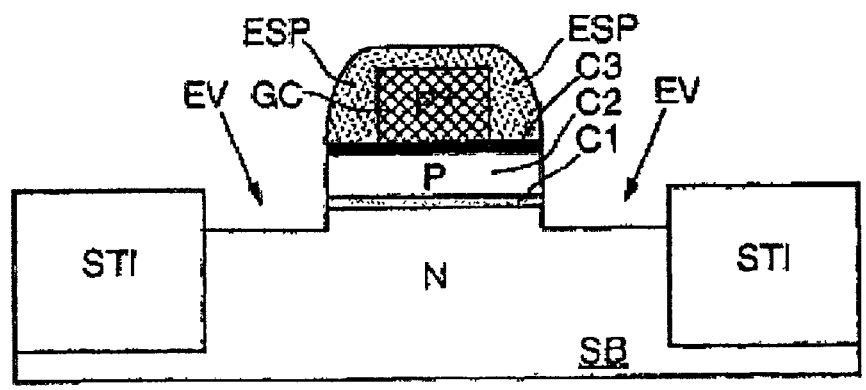

Delete FIG. 9 and insert new FIG. 9

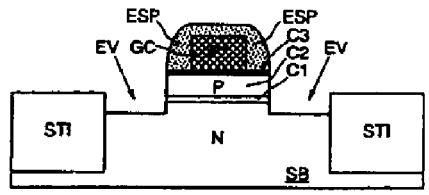

UNITED STATES PATENT AND TRADEMARK OFFICE
CERTIFICATE OF CORRECTION

PATENT NO.    : 6,759,721 B2
DATED         : July 6, 2004
INVENTOR(S)   : Skotnicki et al.

It is certified that error appears in the above-identified patent and that said Letters Patent is hereby corrected as shown below:

Drawings (cont'd),
Delete FIG. 10 and insert new FIG. 10

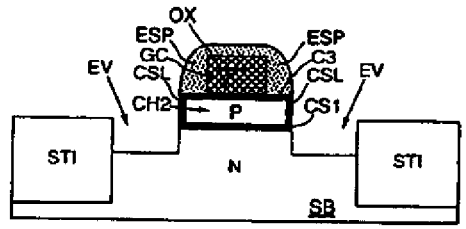

Delete FIG. 11 and insert new FIG. 11

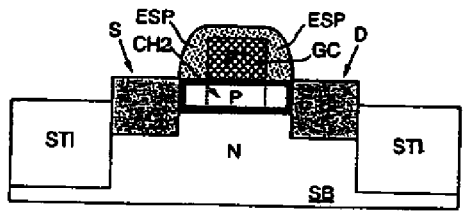

Delete FIG. 12 and insert new FIG. 12

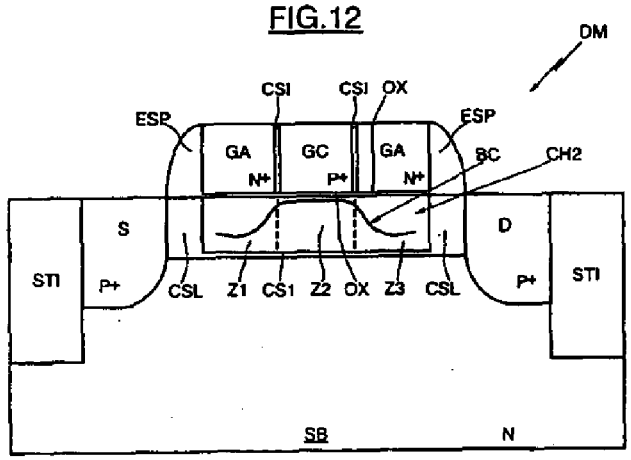

UNITED STATES PATENT AND TRADEMARK OFFICE
CERTIFICATE OF CORRECTION

PATENT NO.   : 6,759,721 B2                                           Page 5 of 8
DATED        : July 6, 2004
INVENTOR(S)  : Skotnicki et al.

It is certified that error appears in the above-identified patent and that said Letters Patent is hereby corrected as shown below:

Drawings (cont'd),
Delete FIG. 13 and insert new FIG. 13

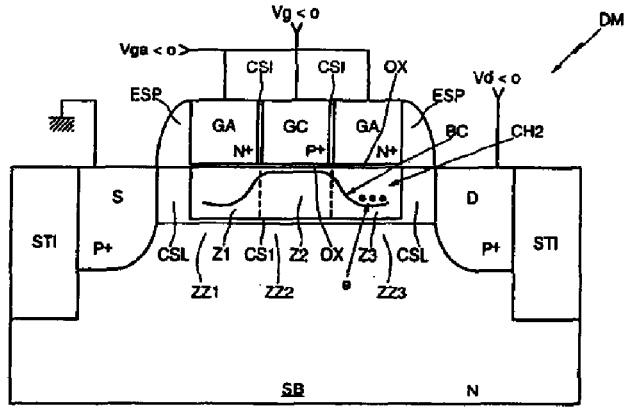

Delete FIG. 14 and insert new FIG. 14

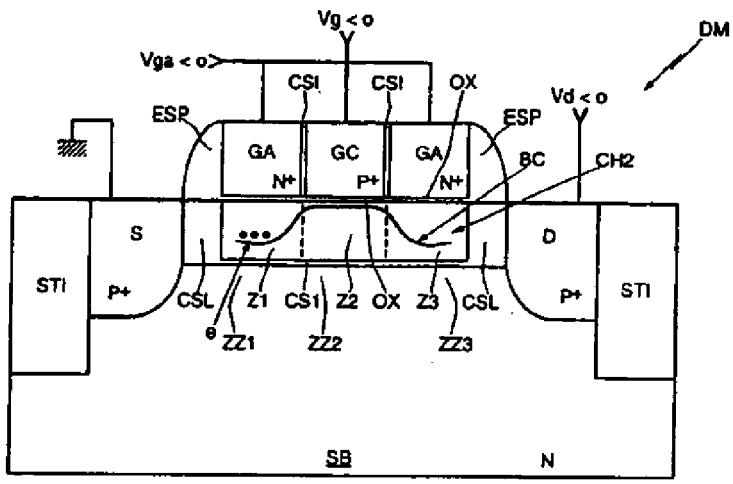

UNITED STATES PATENT AND TRADEMARK OFFICE
CERTIFICATE OF CORRECTION

PATENT NO. : 6,759,721 B2
DATED : July 6, 2004
INVENTOR(S) : Skotnicki et al.

Figure 15:
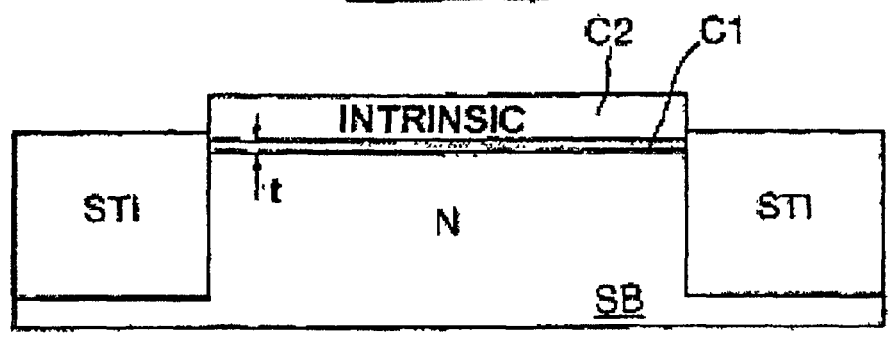
FIGS. 15 to 20 illustrate a second method of implementing the process for fabricating a memory device according to the present invention.

It is certified that error appears in the above-identified patent and that said Letters Patent is hereby corrected as shown below:

Drawings (cont'd),
Delete FIG. 15 and insert new FIG. 15

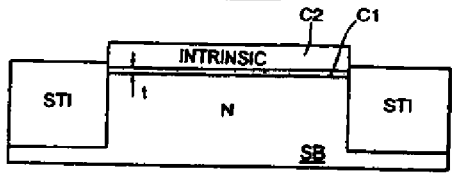

Delete FIG. 16 and insert new FIG. 16

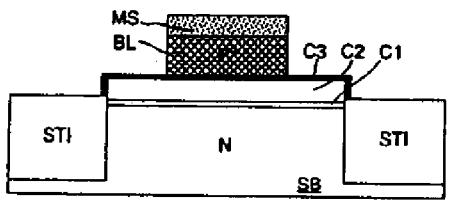

Figure 17:
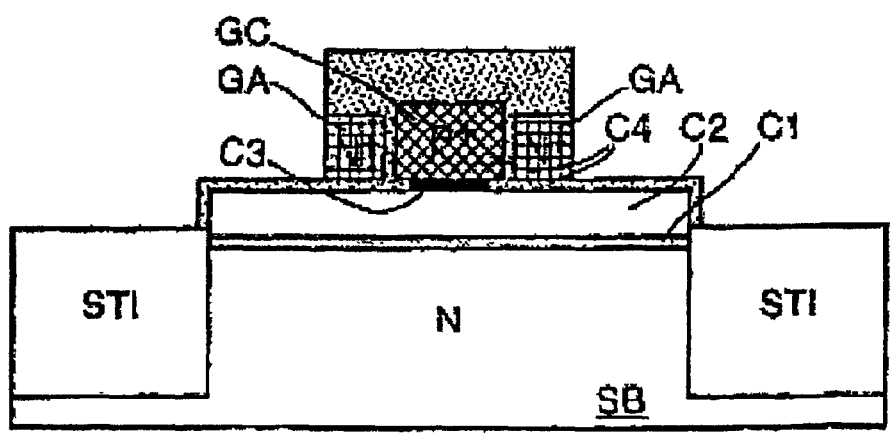

Delete FIG. 17 and insert new FIG. 17

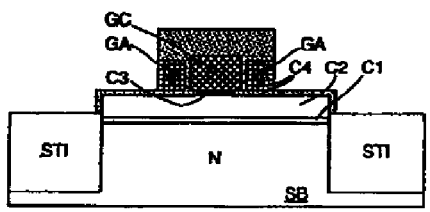

Figure 18:
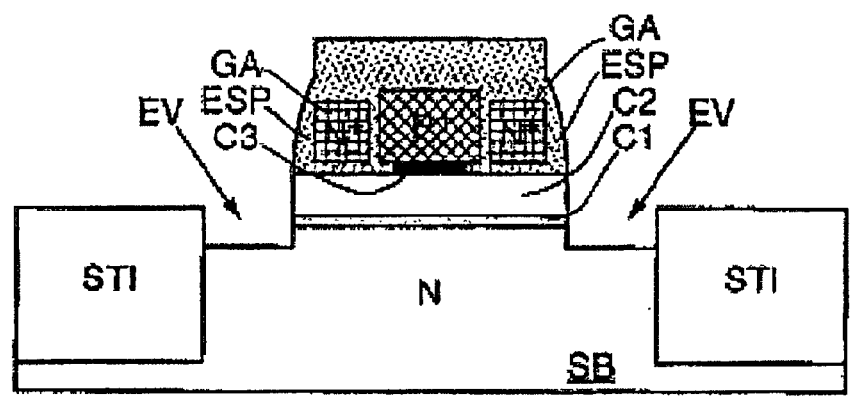

Delete FIG. 18 and insert new FIG. 18

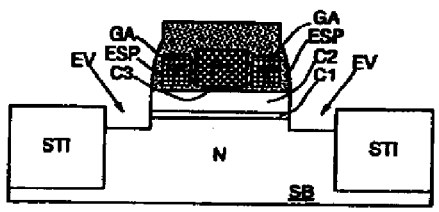

UNITED STATES PATENT AND TRADEMARK OFFICE
CERTIFICATE OF CORRECTION

PATENT NO. : 6,759,721 B2
DATED : July 6, 2004
INVENTOR(S) : Skotnicki et al.

Figure 19:
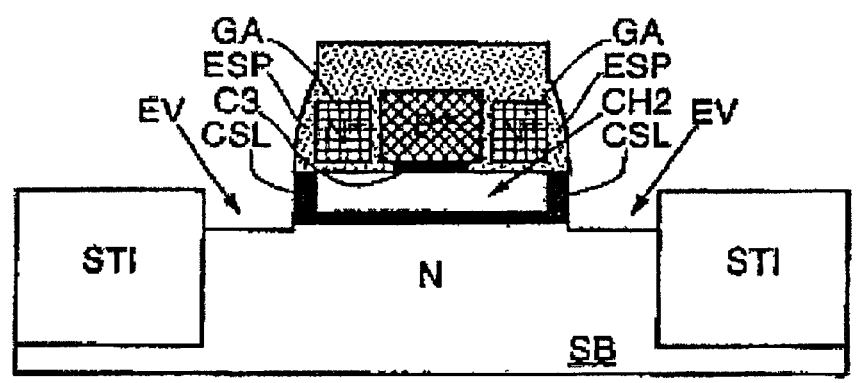
Figure 20:
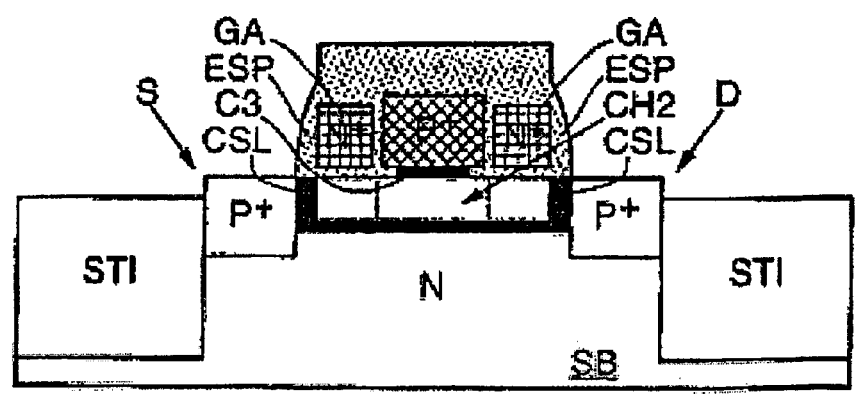

It is certified that error appears in the above-identified patent and that said Letters Patent is hereby corrected as shown below:

Drawings (cont'd),
Delete FIG. 19 and insert new FIG. 19

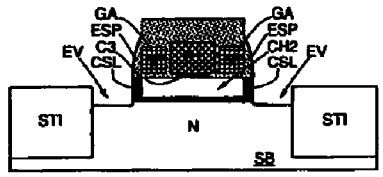

Delete FIG. 20 and insert new FIG. 20

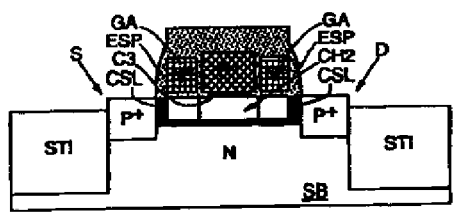

Figure 21:
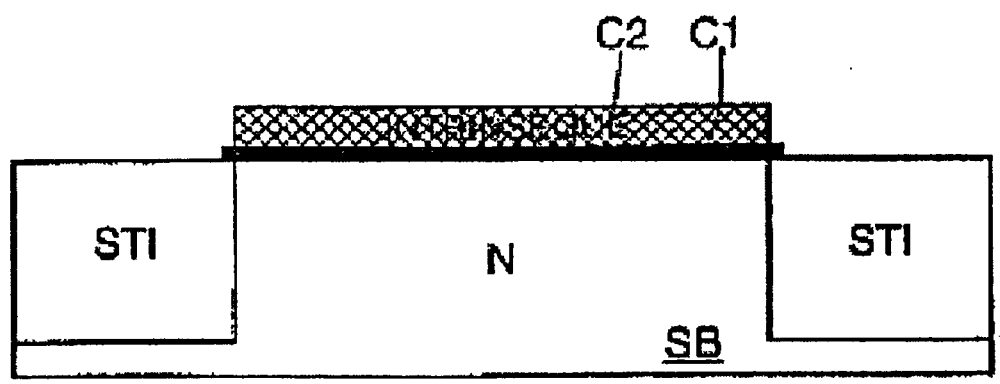
FIGS. 21 to 24 illustrate a third method of implementing the process for fabricating a memory device according to the present invention.

Delete FIG. 21 and insert new FIG. 21

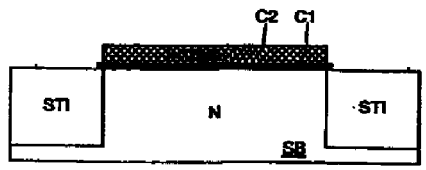

Delete FIG. 22 and insert new FIG. 22

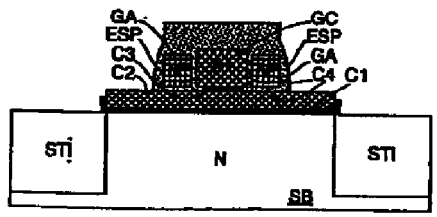

UNITED STATES PATENT AND TRADEMARK OFFICE
CERTIFICATE OF CORRECTION

PATENT NO.    : 6,759,721 B2
DATED         : July 6, 2004
INVENTOR(S)   : Skotnicki et al.

It is certified that error appears in the above-identified patent and that said Letters Patent is hereby corrected as shown below:

Drawings (cont'd),
Delete FIG. 23 and insert new FIG. 23

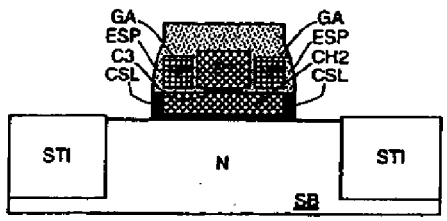

Delete FIG. 24 and insert new FIG. 24

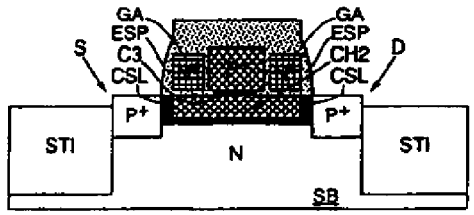

Signed and Sealed this

First Day of March, 2005

JON W. DUDAS
*Director of the United States Patent and Trademark Office*